United States Patent
Chung

(10) Patent No.: US 6,676,812 B2
(45) Date of Patent: Jan. 13, 2004

(54) ALIGNMENT MARK SHIELDING RING WITHOUT ARCING DEFECT AND METHOD FOR USING

(75) Inventor: Chen-Fang Chung, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/143,623

(22) Filed: May 9, 2002

(65) Prior Publication Data

US 2003/0211758 A1 Nov. 13, 2003

(51) Int. Cl.[7] .................. C23C 14/34; C23C 16/00; B05C 21/00
(52) U.S. Cl. .............. 204/192.17; 204/192.12; 204/298.11; 204/298.15; 118/503; 118/720; 118/721; 118/728; 427/282; 427/569
(58) Field of Search ............ 204/192.12, 192.15, 204/192.17, 298.11, 298.15; 118/503, 720, 721, 728; 427/569, 282

(56) References Cited

U.S. PATENT DOCUMENTS 6,171,453 B1 * 1/2001 Chung et al. .......... 204/192.12

* cited by examiner

Primary Examiner—Rodney G. McDonald
(74) Attorney, Agent, or Firm—Tung & Associates

(57) ABSTRACT

An alignment mark shielding ring for use in a physical vapor deposition chamber and a method for using the ring to avoid arcing problems on the wafer. The alignment mark shielding ring can be constructed of a ring that has a generally L-shaped cross-section, at least one hood portion to function as the shield for the alignment mark, at least one alignment pin for engaging at least one alignment sleeve mounted in a lower chamber shield for holding the alignment mark shielding ring in place. The alignment sleeve is constructed in two halves, each having an aperture therethrough. The aperture in the top half is larger than the aperture in the bottom half such that even when the apertures are coated with a metal layer deposited in the PVD process, the alignment pin does not electrically short to the lower chamber shield and thus, any possibility of arcing is avoided.

20 Claims, 5 Drawing Sheets

ALIGNMENT MARK SHIELDING RING WITHOUT ARCING DEFECT AND METHOD FOR USING

FIELD OF THE INVENTION

The present invention generally relates to a semiconductor process tool and a method for using the tool and more particularly, relates to an alignment mark shielding ring for use in a semiconductor process chamber without the occurrence of arcing between the alignment mark shielding ring and the process chamber.

BACKGROUND OF THE INVENTION

Physical vapor deposition (PVD) is a frequently used processing technique in the manufacture of integrated circuit chips that involves the deposition of a metallic layer on the surface of a silicon wafer. The technique is also known as a sputtering process. In more recently developed advanced semiconductor manufacturing technology, the PVD technique is frequently used to deposit metallic layers such as TiN as anti-reflective coating or barrier layers.

In a typical PVD process, an inert gas such as argon is first ionized in an electrical field producing a plasma of charged gas particles. The particles are then attracted toward a negatively charged source (or target). The energy of these gas particles physically dislodges, or sputters of atoms of the metallic target material. PVD is a versatile technique in that many different materials can be deposited by using an RF or a DC power source.

In a typical PVD process chamber 10, as shown in FIG. 1, major components of the chamber include a stainless steel chamber body 12 that is vacuum tight and is equipped with a pump 16 capable of reducing the chamber pressure to at least $10^{-6}$ m Torr, a pressure gauge 18, a sputter source or target 20, a power supply (not shown), a wafer holder 14 and a clamp ring 22. The sputter source 20 and the wafer holder 14 are positioned facing each other. The target may be a titanium disc when sputtering of TiN is desired. One of such PVD process chamber is commercially available as Endura® 5500 from Applied Materials, Inc. of Santa Clara, Calif.

The wafer holder 14 is normally a pedestal of a disc shape. In a top surface of the pedestal, metal screws 24 are used as pedestal pins for supporting a wafer 26 at the tips of the screws 24. The pedestal pins allow a gap of approximately 1 mm to be maintained between the wafer 26 and the top surface 28 of the pedestal body 14. The distance is necessary such that a subsequently deposited film, for instance, a TiN layer does not glue the wafer to the pedestal surface 28. A thin TiN layer is frequently used on top of an aluminum-copper film layer as an anti-reflective coating for a subsequent lithography process. In a typical PVD deposition process, a plasma cloud 30 is generated by a cascading ionization reaction in which electrons and ion pairs are formed. For instance, when an electron bumps into an argon atom, it forms an argon ion and another electron. The newly formed electron then collides with another argon atom such that a chain reaction or ionization reaction is started. When the electrons bombard the wafer surface, the surface may be charged to a negative voltage higher than 30 volts.

One of the more important components in a sputter chamber is the clamp ring 22 which serves several functions during a sputter process. For instance, one of the functions is to clamp a wafer to a pedestal heater. The clamp ring holds the wafer in place on the pedestal when a positive gas pressure is applied between the heater and the pedestal such that heat can be efficiently conducted from the heater to the wafer. Another function served by the clamp ring is to allow a predetermined flow of argon to leak from under the wafer into the sputter chamber. A clamp ring is constructed in a circular shape with an oriented cutout to match a wafer's flat side. A hood portion 32 is built into the clamp ring 22 for shadowing purpose to protect the lip of the clamp ring from being coated by the sputtered metal particles. A plane view of the clamp ring 22 and the hood portion 32 of the clamp ring are shown in FIG. 2.

One other function served by the clamp ring 22, and specifically by the hood portion 32 is the shielding of specific area along the edge of a wafer that should not be covered by sputtered metal particles. A typical area is the alignment marks which are scribed onto a top surface of a wafer for alignment in various process machines and onto various wafer platforms. An alignment mark would not be recognizable in a subsequent lithography process if covered by sputtered metals. The protection of an alignment mark from sputtered metal particles is therefore an important step in a sputtering process.

FIGS. 3A and 3B show a conventional physical vapor deposition chamber with a wafer pedestal in a release and in a process position, respectively. The PVD chamber 40 is constructed of a wafer pedestal 42, a clamp ring 44, an upper chamber shield 46 and a lower chamber shield 48 which are enclosed in chamber wall 50. A clamp shield 52 and an adapter plate 54 for mounting the upper shield 46 and the lower shield 48 thereto are further shown in FIGS. 3A and 3B.

A perspective view of the major components in the PVD chamber 40 is shown in FIG. 4. It should be noted that in this conventional construction of a PVD chamber, the clamp ring 44 is not equipped with an extended hood portion for shielding an edge portion of the wafer or for shielding an alignment mark formed on the wafer.

In a modified conventional PVD chamber 60, as shown in FIGS. 5A and 5B, attempts have been made to shield an edge portion of a wafer by an improved clamp ring 64 and to fix the position of the clamp ring in relation to the wafer 26 by alignment pins 66. In this conventional construction, a modified clamp ring 64 which is equipped with an extended hood portion 70 is used to shield an edge portion 72 of the wafer 26. The modified clamp ring 64 is further equipped with alignment pins 66 which are fixed to an edge 74 of the clamp ring 64. Correspondingly located apertures 62 are provided for positioning the alignment pins 66. The alignment pins 66 and the locating apertures 62 are provided such that the locating pins 66 may enter or exit the locating apertures 62 freely when the clamp ring 64 is lifted up by the wafer pedestal 42 away from the apertures or lowered into the apertures. This is shown in FIGS. 5A and 5B in an release and a process position, respectively.

In another modified conventional PVD chamber 80, as shown in FIG. 6, attempts were made to improve the better positioning of the alignment pin 66 in an alignment sleeve 82. The alignment sleeve 82, also known as a DC bias isolator, is fabricated of an electrically insulating material. The alignment sleeve 82 provides electrical insulation between the metallic alignment pin 66 and the metallic lower chamber shield 68. The alignment pin 66 and the lower chamber shield 68 are normally fabricated of stainless steel.

While the alignment sleeve 82 provides the necessary electrical insulation at the beginning of a semiconductor process, i.e., a metal sputtering process, a thin film of metal gradually deposits inside the aperture 84 of the alignment sleeve 82. For instance, during a TiN deposition process, a thin film of TiN gradually grows on the side wall of the aperture 84. After the process chamber is used for sputtering a large number of wafers, the thickness of the TiN layer inside the aperture 84 becomes sufficiently large to cause an electrical short between the alignment pin 66 and the lower chamber shield 68 (when the surface of the alignment sleeve 82 becomes electrically conductive). When such electrical short occurs, serious arcing problem may occur on the wafer surface which may lead to the scrap of the entire wafer. The arcing problem must therefore be prevented if at all possible to preserve the yield of the process.

It is therefore an object of the present invention to provide an alignment mark shielding ring that does not have the drawbacks or shortcomings of the conventional alignment mark shielding rings.

It is another object of the present invention to provide an alignment mark shielding ring for use in a process chamber that does not cause the arcing defect.

It is a further object of the present invention to provide an alignment mark shielding ring that is equipped with alignment pins for locating the alignment mark shielding ring.

It is another further object of the present invention to provide an alignment mark shielding ring that is equipped with alignment pins for engaging alignment sleeves mounted in a lower chamber shield of the process chamber.

It is still another object of the present invention to provide an alignment mark shielding ring equipped with alignment pins for engaging a two-part alignment sleeve situated in a lower chamber shield wherein the two-part alignment sleeve prevents a short between the alignment pin and the lower chamber shield.

It is yet another object of the present invention to provide a method for using an alignment mark shielding ring without the occurrence of arcing in a process chamber.

SUMMARY OF THE INVENTION

In accordance with the present invention, an alignment mark shielding ring capable of preventing arcing defect and a method for using the ring are provided.

In a preferred embodiment, an alignment mark shielding ring for use in a process chamber is provided which includes a ring that has a generally L-shaped cross-section with a first section of the L parallel to a plane of the ring and a second section of the L perpendicular to the plane of the ring; at least one hood portion extending from the first section of the L of the ring for shielding at least one alignment mark situated on a wafer; at least one alignment pin extending from the second section of the L of the ring in a downward direction; and at least one alignment sleeve situated in a lower chamber shield of the process chamber for engaging the at least one alignment pin, each of the at least one alignment sleeve being formed of an electrically insulating material and by an upper sleeve and a lower sleeve stacked together and making point contact through at least three protrusions situated on a contact surface of one of the upper and lower sleeves, each of the upper and lower sleeves have an aperture therethrough for engaging the at least one alignment pin, a first diameter of the aperture in the upper sleeve is at least 1 mm larger than a second diameter of the aperture in the lower sleeve such that even when the apertures are coated with an electrically conductive coating, the at least one alignment pin is not shorted to the lower chamber shield of the process chamber.

In the alignment mark shielding ring for use in a process chamber, the first diameter is preferably at least 2 mm larger than the second diameter. The alignment mark shielding ring may be fabricated of stainless steel. The at least one alignment pin and the lower chamber shield may also be fabricated of stainless steel. The electrically insulating material for fabricating the alignment sleeves is a ceramic material. The at least three protrusions each may have a half-circular cross-section, or each may have a dimension of at least 1.5 mm in width and at least 1.5 mm in height. The second diameter may be 1 mm larger than a diameter of the at least one alignment pin such that the at least one alignment pin penetrates the aperture in the lower sleeve without any frictional force. The alignment mark shielding ring may be a clamp ring for a wafer positioned in the process chamber. The at least one alignment pin may be mechanically joined to the second section of the L of the ring.

The present invention is further directed to a pedestal system that is equipped with an arc-proof alignment mark shielding ring for use in a process chamber which includes a pedestal that has a diameter larger than a diameter of a wafer it carries on a top surface, the pedestal may be operable in an up-and-down motion by an elevating means; and an alignment mark shielding ring for engaging the top surface of the pedestal with the wafer therein-between, the alignment mark shield ring has at least one alignment pin extending downwardly penetrating at least one alignment sleeve mounted in a lower chamber shield of the process chamber, the at least one alignment sleeve may be formed of an electrically insulating material and by an upper sleeve and a lower sleeve stacked together and making point contact through at least three protrusions situated on a contact surface of one of the upper and lower sleeves, each of the upper and lower sleeves has an aperture therethrough for engaging the at least one alignment pin, a first diameter of the aperture in the upper sleeve may be at least 1 mm larger than a second diameter of the aperture in the lower sleeve such that even when the apertures are coated with an electrically conductive coating, the at least one alignment pin is not shorted to the lower chamber shield of the process chamber.

In the pedestal system equipped with an arc-proof alignment mark shielding ring for use in a process chamber, the first diameter is preferably at least 2 mm larger than the second diameter. The at least three protrusions each may have a dimension of at least 1.5 mm in width and at least 1.5 mm in height. The alignment mark shielding ring, the at least one alignment pin and the lower chamber shield may be fabricated of stainless steel. The second diameter may be at least 1 mm larger than a diameter of the at least one alignment pin such that the at least one alignment pin penetrates the aperture in the lower sleeve without any frictional force.

The present invention is still further directed to a method for shielding an alignment mark on a wafer in a process chamber which can be carried out by the operating steps of first providing a pedestal that has a diameter larger than a diameter of a wafer it carries on a top surface, the pedestal is operable in an up-and-down motion by an elevating means; providing an alignment mark shielding ring for engaging the top surface of the pedestal with the wafer therein-between, the alignment mark shielding ring may be equipped with at least one alignment pin extending downwardly; providing at least one alignment sleeve mounted in a lower chamber shield of the process chamber, the at least one alignment sleeve is formed of an electrically insulating material and by an upper sleeve and a lower sleeve stacked together and making point contact through at least three protrusions situated on a contact surface of one of the upper and lower sleeves, each of the upper and lower sleeves has an aperture therethrough for engaging the at least one alignment pin, a first diameter of the aperture in the upper sleeve is at least 1 mm larger than a second diameter of the aperture in the lower sleeve such that even when the apertures are coated with an electrically conductive coating, the at least one alignment pin is not shorted to the lower chamber shield of the process chamber; mounting the alignment mark shielding ring on top of the pedestal such that the at least one alignment pin penetrates the at least one alignment sleeve; and conducting a fabrication process in the process chamber.

The method for shielding an alignment mark on a wafer in a process chamber may further include the step of providing the first diameter of the aperture in the upper sleeve at least 2 mm larger than the second diameter of the aperture in the lower sleeve. The method may further include the step of fabricating the at least one alignment pin and the lower chamber shield in stainless steel. The method may further include the step of conducting the fabrication process in a TiN sputtering process. The method may further include the step of coating the apertures with a TiN layer.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
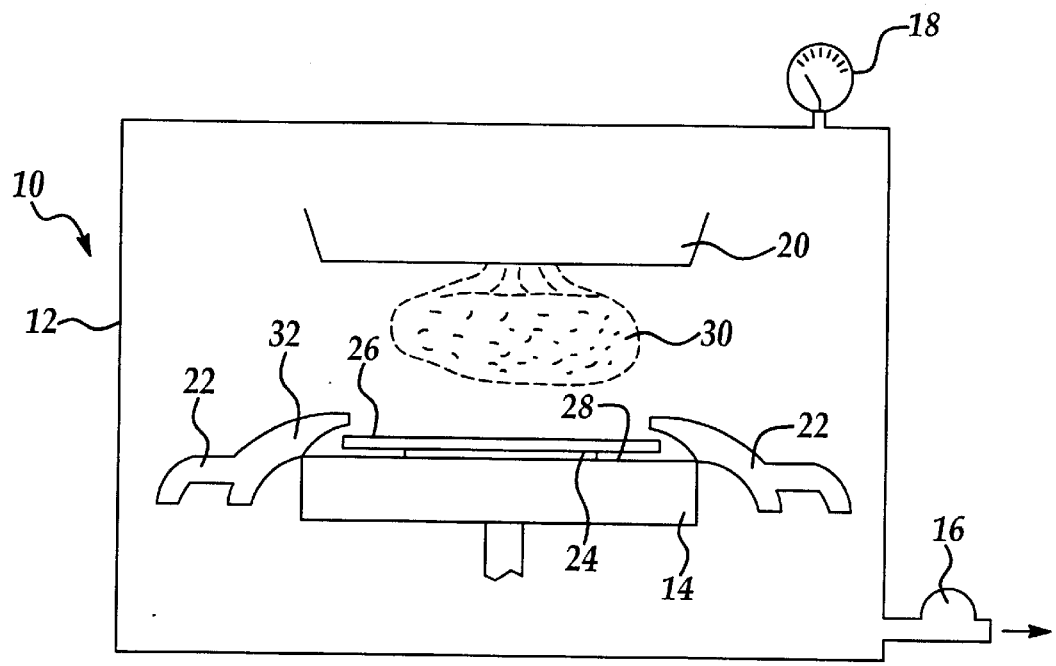
FIG. 1 is a schematic illustrating a conventional physical vapor deposition process in a sputtering chamber.
Figure 2:
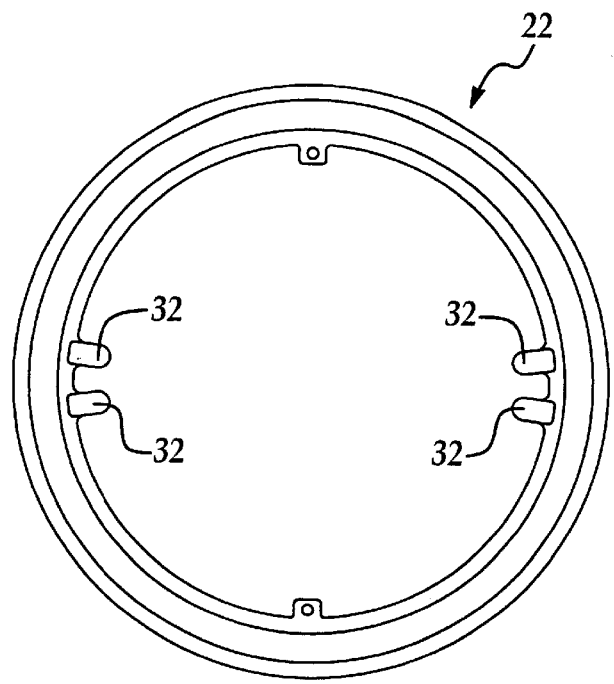
FIG. 2 is a plane view of a conventional alignment mark shielding ring.
Figure 3A:
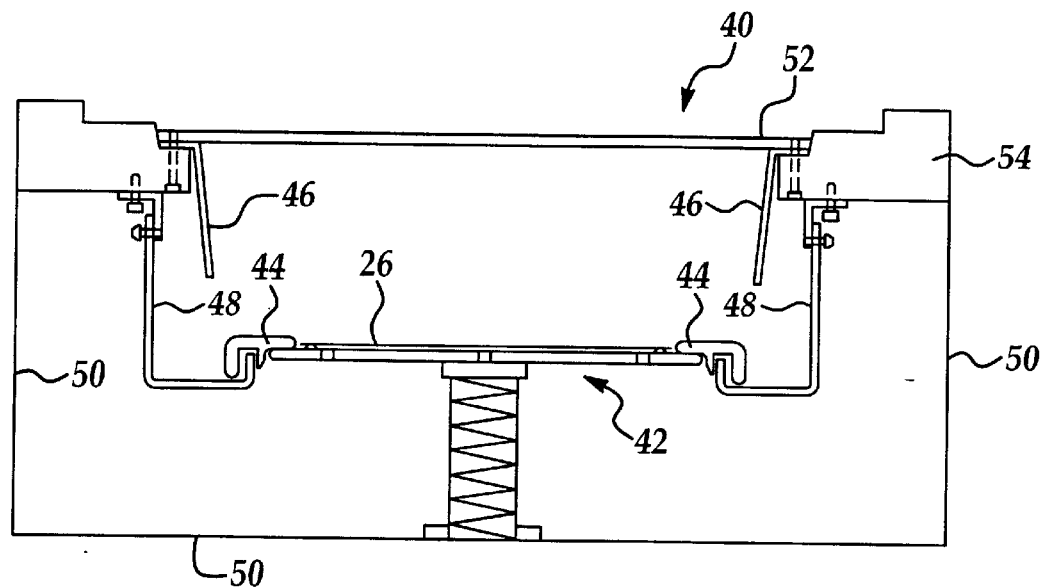
FIG. 3A is a cross-sectional view of a PVD chamber equipped with an alignment mark shielding ring with the ring in a process position.
Figure 3B:
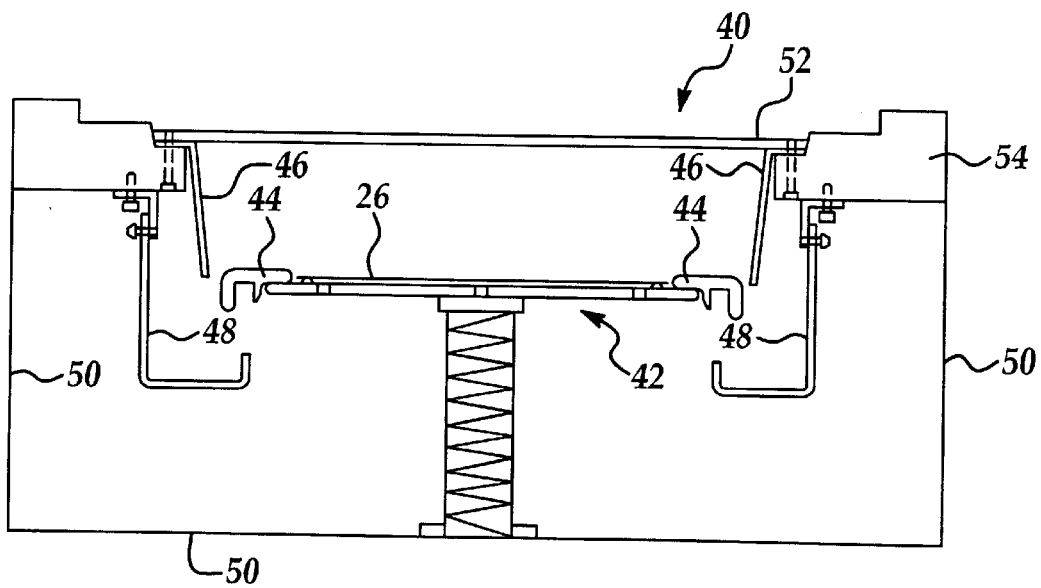
FIG. 3B is a cross-sectional view of the PVD chamber of FIG. 3A with the alignment mark shielding ring in a release position.
Figure 4:
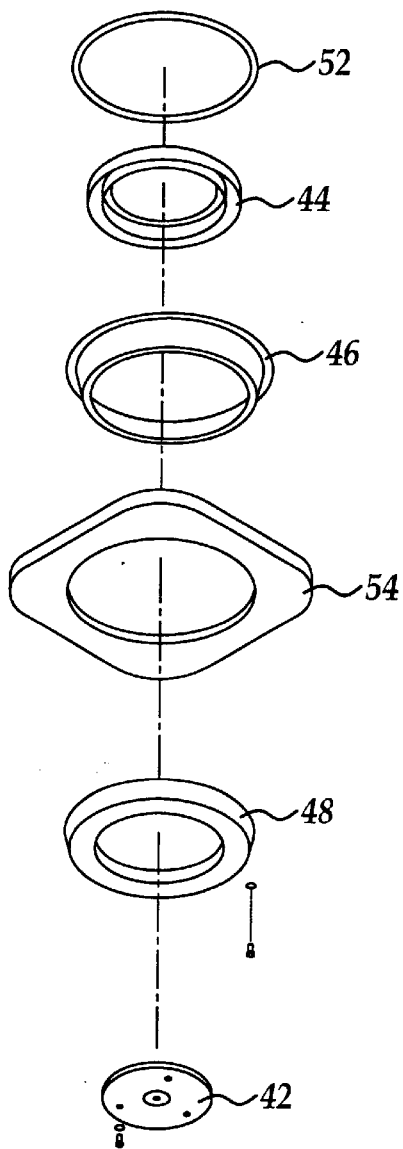
FIG. 4 is a perspective view of the various components in the conventional PVD chamber including the alignment mark shielding ring.
Figure 6:
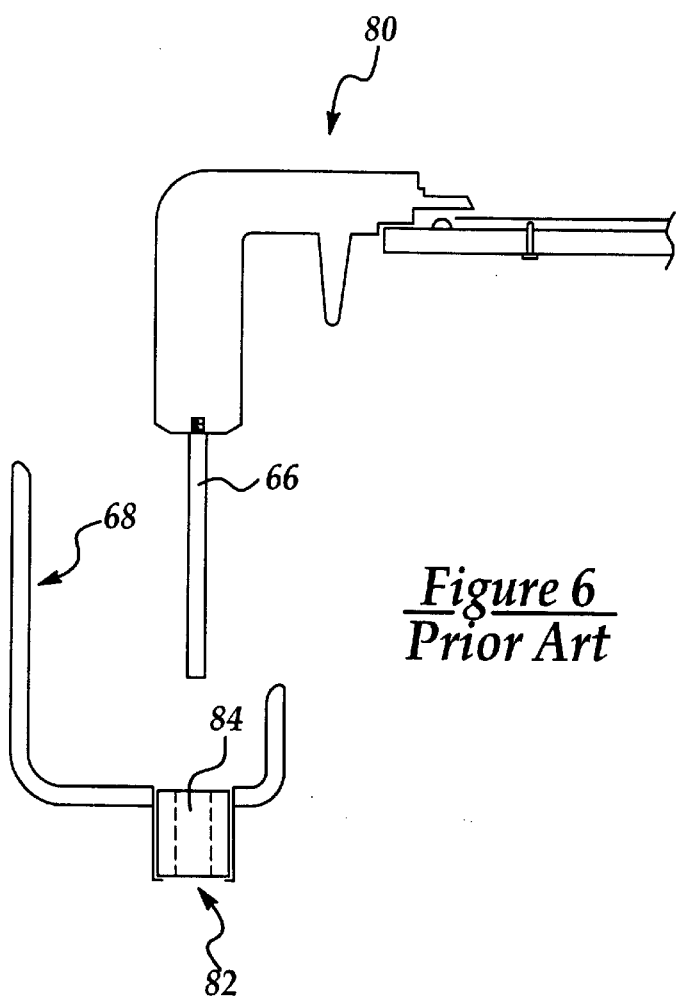
FIG. 6 is a partial, enlarged cross-sectional view of the alignment mark shielding ring equipped with the alignment pin positioned relative to an alignment sleeve situated in a lower chamber shield.
Figure 5A:
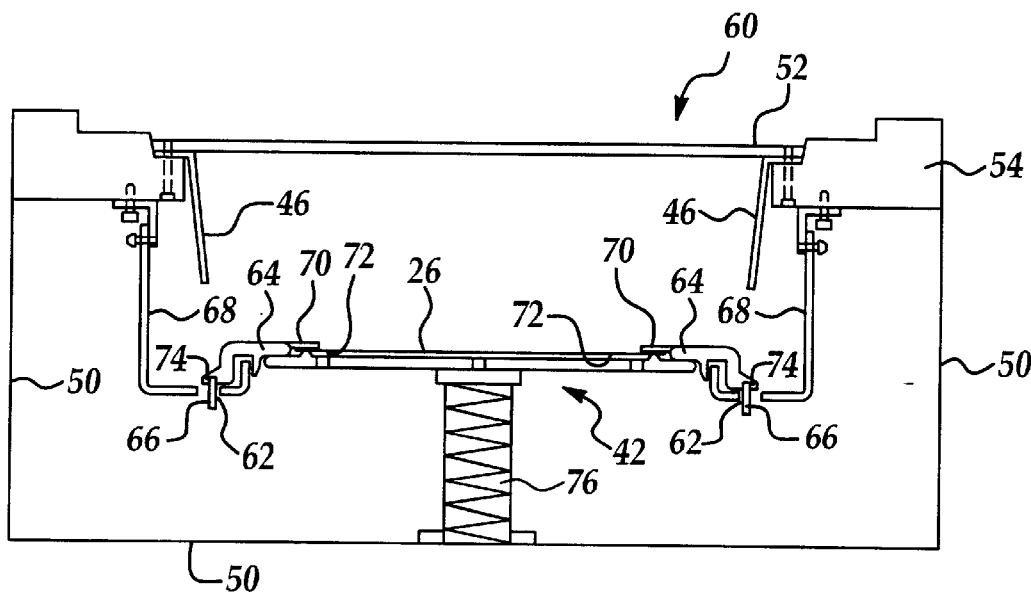
FIG. 5A is a cross-sectional view of another conventional PVD chamber equipped with an improved alignment mark shielding ring in a process position.
Figure 5B:
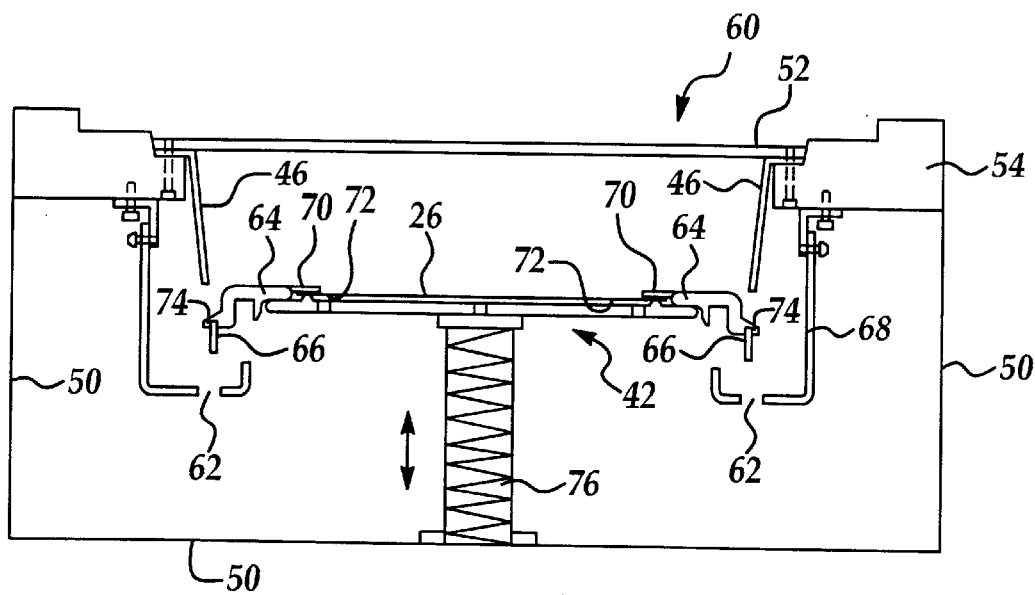
FIG. 5B is a cross-sectional view of the PVD chamber of FIG. 5A with the improved alignment mark shielding ring in a release position.

The present invention discloses an alignment mark shielding ring for use in a process chamber that does not cause arcing on the wafer and a method for using the alignment mark shielding ring.

The alignment mark shielding ring of the present invention is constructed of a ring that has a generally L-shaped cross-section, at least one hood portion and at least one alignment pin extending from the ring in a radial direction and in a circumferential direction, respectively. The structure further includes at least one alignment sleeve mounted in a lower chamber shield for engaging the at least one alignment pin. Each of the at least one alignment sleeve is formed of an electrically insulating material and in a two-part configuration of an upper sleeve and a lower sleeve. The two sleeves are stacked together by making point contact through at least three protrusions situated on a contact surface of one of the upper and lower sleeves. Each of the upper and lower sleeves is further provided with an aperture therethrough for engaging the at least one alignment pin. A first diameter of the aperture in the upper sleeve is at least 1 mm larger, and preferably at least 2 mm larger, than a second diameter of the aperture in the lower sleeve such that even when the apertures are coated with an electrically conductive coating, the at least one alignment pin is not shorted to the lower chamber shield of the process chamber through the alignment sleeve.

The invention further discloses a pedestal system that is equipped with an arc-proof alignment mark shielding ring for use in a process chamber which includes a pedestal that has a diameter larger than a diameter of a wafer it carries on a top surface, the pedestal is operable in an up-and-down motion by an elevating means, and an alignment mark shielding ring which is substantially described as above.

The invention still further discloses a method for shielding an alignment mark on a wafer positioned in a process chamber which can be carried out by the operating steps of first providing a pedestal that has a diameter larger than a diameter of a wafer it carries on a top surface; then providing an alignment mark shielding ring for engaging the top surface of the pedestal with the wafer therein between, the alignment mark shielding ring is equipped with at least one alignment pin that extends downwardly; then providing at least one alignment sleeve mounted in a lower chamber shield of the process chamber, the at least one alignment sleeve is formed of an electrically insulating material and by an upper sleeve and a lower sleeve stacked together and making point contact through at least three protrusions situated on a contact surface of one of the upper and lower sleeves. Each of the upper and lower sleeves has an aperture therethrough for engaging the at least one alignment pin. A first diameter of the aperture in the upper sleeve may be at least 1 mm, and preferably at least 2 mm larger than a second diameter of the aperture in the lower sleeve such that even when the apertures are coated with an electrically conductive coating, the at least one alignment pin is not shorted to the lower chamber shield of the process chamber; then mounting the alignment mark shielding ring on top of the pedestal such that the at least one alignment pin penetrates the at least one alignment sleeve; and conducting a fabrication process in the process chamber.

Figure 7:
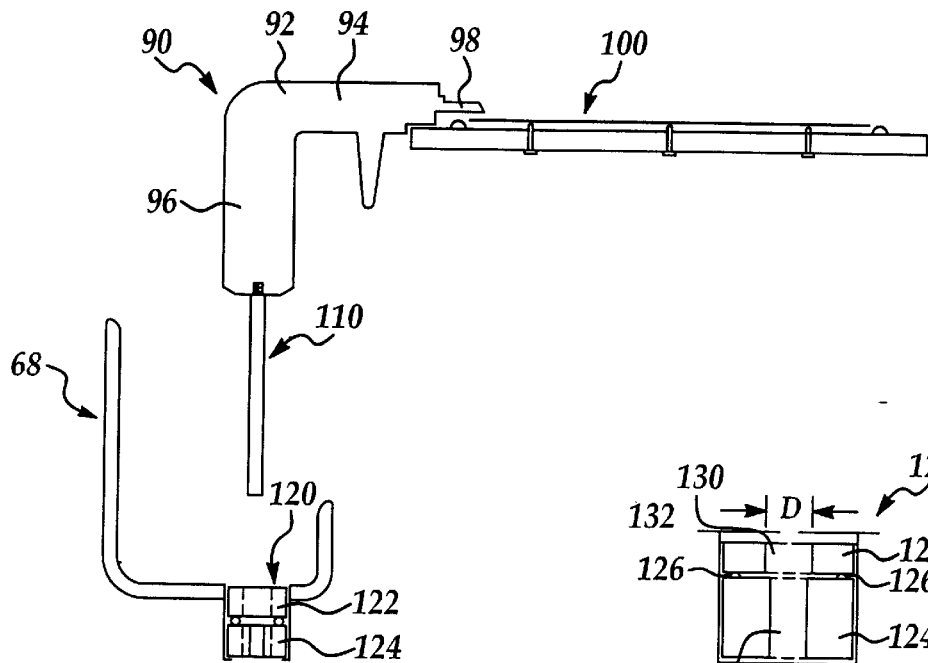
FIG. 7 is a partial, enlarged cross-sectional view of a present invention alignment mark shielding ring equipped with the alignment pin positioned adjacent to an improved alignment sleeve mounted in a lower chamber shield.
Figure 7A:
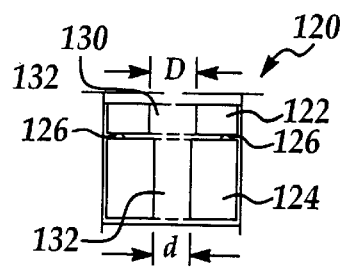
FIG. 7A is an enlarged, cross-sectional view of the present invention two-part alignment sleeve.
Figures 8A, 8B, 8C:
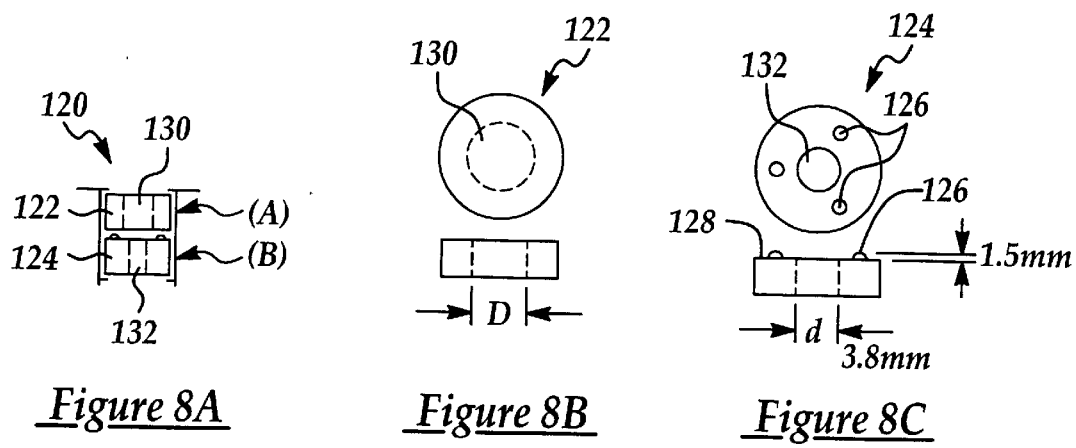
FIG. 8A is an enlarged, cross-sectional view of another embodiment of the present invention two-part alignment sleeve.
FIG. 8B is an enlarged, cross-sectional view and a plane view of the upper sleeve for the present invention two-part alignment sleeve.
FIG. 8C is an enlarged, cross-sectional view and a plane view of the lower sleeve of the present invention two-part alignment sleeve.

Referring now to FIG. 7, wherein a present invention alignment mark shielding ring 90 is shown. The alignment mark shielding ring 90 is constructed of a ring member 92 that has a generally L-shaped cross-section with a first section 94 of the L parallel to a plane of the ring and a second section 96 of the L perpendicular to the plane of the ring 90. On the alignment mark shield ring 90, at least one hood portion 98 extends from the first section 94 of the L of the ring 90 for shielding at least one alignment mark (not shown) situated on a wafer 100. The alignment mark shielding ring 90 is further provided with at least one alignment pin 110 which extends from the second section 96 of the L of the ring 90 in a downward direction. The alignment pin 110 is adapted for engaging an alignment sleeve 120 that is mounted in a lower chamber shield 68. The alignment sleeve 120 is further shown in an enlarged, cross-sectional view of FIG. 7A. FIG. 8A further shows another embodiment of the alignment sleeve 120 in which the thickness of the upper sleeve 122 and the lower sleeve 124 are approximately the same. This is contrary to that shown in FIG. 7A wherein the thickness of the upper sleeve 122 is substantially smaller than the thickness of the lower sleeve 124. The alignment sleeve 120 is formed of an electrically insulating material, i.e. such as a ceramic material, and by the upper sleeve 122 and the lower sleeve 124 which are stacked together and making point contact through at least three protrusions 126 situated on a contact surface 128 of one of the upper and lower sleeves, i.e. on the lower sleeve 124 shown in FIG. 8C.

Each of the upper and lower sleeves 122,124 have apertures 130,132 therethrough for engaging the at least one alignment pin 110. A first diameter "D" of the aperture 130 in the upper sleeve 122 is at least 1 mm, and preferably at least 2 mm larger than a second diameter "d" of the aperture 134 in the lower sleeve 124 such that even when the apertures 130,132 are coated with an electrically conductive coating, the at least one alignment pin 110 is not shorted through the alignment sleeve 120 to the lower chamber shield 68 of the process chamber.

It should be noted, as shown in FIGS. 8B and 8C, a workable dimension for the aperture 130 in the upper sleeve is about 6 mm, while a workable dimension for the aperture 132 in the lower sleeve 124 is about 3.8 mm. The protrusions 126 may be formed in a half-circular cross-section, with a dimension of 1.5 mm width and 1.5 mm height.

When the present invention alignment mark shielding ring 90 and the alignment sleeve 120 are utilized in a physical vapor deposition process for TiN, even though the apertures 130,132 are covered with a layer of TiN, the alignment pin 120 may be in physical contact with aperture 132 in the lower sleeve 124, however, the alignment pin 110 is not in physical contact with the aperture 130 in the upper sleeve 122. Any possibility of an electrical short between the alignment pin 110 and the lower chamber shield 68 can thus be avoided. Any potential arcing on the wafer 100 is also prevented.

The present invention apparatus of an alignment mark shielding ring and a method for using the ring to avoid arcing defect between an alignment pin and a lower chamber shield of the process chamber have therefore been amply described in the above description and in the appended drawings of FIGS. 7, 7A, 8A, 8B and 8C.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. An alignment mark shielding ring for use in a process chamber comprising:

a ring having a generally L-shaped cross-section with a first section of the L parallel to a plane of the ring and a second section of the L perpendicular to the plane of the ring;

at least one hood portion extending from said first section of the L of said ring for shielding at least one alignment mark situated on a wafer;

at least one alignment pin extending from said second section of the L of said ring in a downward direction; and at least one alignment sleeve situated in a lower chamber shield of said process chamber for engaging said at least one alignment pin, each of said at least one alignment sleeve being formed of an electrically insulating material and by an upper sleeve and a lower sleeve stacked together and making point contact through at least three protrusions situated on a contact surface of one of said upper and lower sleeves, each of said upper and lower sleeves having an aperture therethrough for engaging said at least one alignment pin, a first diameter of said aperture in said upper sleeve being at least 1 mm larger than a second diameter of said aperture in said lower sleeve such that even when said apertures are coated with an electrically conductive coating, the at least one alignment pin is not shorted to the lower chamber shield of the process chamber.

2. An alignment mark shielding ring for use in a process chamber according to claim 1, wherein said first diameter is preferably at least 2 mm larger than said second diameter.

3. An alignment mark shielding ring for use in a process chamber according to claim 1, wherein said alignment mark shielding ring is fabricated of stainless steel.

4. An alignment mark shielding ring for use in a process chamber according to claim 1, wherein said at least one alignment pin and said lower chamber shield are fabricated of stainless steel.

5. An alignment mark shielding ring for use in a process chamber according to claim 1, wherein said electrically insulating material is a ceramic.

6. An alignment mark shielding ring for use in a process chamber according to claim 1, wherein said at least three protrusions each having a half-circular cross-section.

7. An alignment mark shielding ring for use in a process chamber according to claim 1, wherein said at least three protrusions each having a dimension of at least 1.5 mm in width and at least 1.5 mm in height.

8. An alignment mark shielding ring for use in a process chamber according to claim 1, wherein said second diameter is at least 1 mm larger than a diameter of said at least one alignment pin such that said at least one alignment pin penetrates said aperture in said lower sleeve without any frictional force.

9. An alignment mark shielding ring for use in a process chamber according to claim 1, wherein said alignment mark shielding ring is a clamp ring for a wafer positioned in said process chamber.

10. An alignment mark shielding ring for use in a process chamber according to claim 1, wherein said at least one alignment pin is mechanically joined to said second section of the L of said ring.

11. A pedestal system equipped with an arc-proof alignment mark shielding ring for use in a process chamber comprising:
   a pedestal having a diameter larger than a diameter of a wafer it carries on a top surface, said pedestal being operable in an up-and-down motion by an elevating means; and
   an alignment mark shielding ring for engaging said top surface of the pedestal with said wafer therein-between, said alignment mark shield ring having at least one alignment pin extending downwardly penetrating at least one alignment sleeve mounted in a lower chamber shield of said process chamber, said at least one alignment sleeve being formed of an electrically insulating material and by an upper sleeve and a lower sleeve stacked together and making point contact through at least three protrusions situated on a contact surface of one of said upper and lower sleeves, each of said upper and lower sleeves having an aperture therethrough for engaging said at least one alignment pin, a first diameter of said aperture in said upper sleeve being at least 1 mm larger than a second diameter of said aperture in said lower sleeve such that even when said apertures are coated with an electrically conductive coating, the at least one alignment pin is not shorted to the lower chamber shield of the process chamber.

12. A pedestal system equipped with an arc-proof alignment mark shielding ring for use in a process chamber according to claim 11, wherein said first diameter is preferably at least 2 mm larger than said second diameter.

13. A pedestal system equipped with an arc-proof alignment mark shielding ring for use in a process chamber according to claim 11, wherein said at least three protrusions each having a dimension of at least 1.5 mm in width and at least 1.5 mm in height.

14. A pedestal system equipped with an arc-proof alignment mark shielding ring for use in a process chamber according to claim 11, wherein said alignment mark shielding ring, said at least one alignment pin and said lower chamber shield are fabricated of stainless steel.

15. A pedestal system equipped with an arc-proof alignment mark shielding ring for use in a process chamber according to claim 11, wherein said second diameter is at least 1 mm larger than a diameter of said at least one alignment pin such that said at least one alignment pin penetrates said aperture in said lower sleeve without any frictional force.

16. A method for shielding an alignment mark on a wafer in a process chamber comprising the steps of:
   providing a pedestal having a diameter larger than a diameter of a wafer it carries on a top surface, said pedestal being operable in an up-and-down motion by an elevating means;
   providing an alignment mark shielding ring for engaging said top surface of the pedestal with said wafer therein-between, said alignment mark shielding ring being equipped with at least one alignment pin extending downwardly;
   providing at least one alignment sleeve mounted in a lower chamber shield of said process chamber, said at least one alignment sleeve being formed of an electrically insulating material and by an upper sleeve and a lower sleeve stacked together and making point contact through at least three protrusions situated on a contact surface of one of said upper and lower sleeves, each of said upper and lower sleeves having an aperture therethrough for engaging said at least one alignment pin, a first diameter of said aperture in said upper sleeve being at least 1 mm larger than a second diameter of said aperture in said lower sleeve such that even when said apertures are coated with an electrically conductive coating, said at least one alignment pin is not shorted to said lower chamber shield of the process chamber;
   mounting said alignment mark shielding ring on top of said pedestal such that said at least one alignment pin penetrates said at least one alignment sleeve; and
   conducting a fabrication process in said process chamber.

17. A method for shielding an alignment mark on a wafer in a process chamber according to claim 16 further comprising the step of providing said first diameter of the aperture in the upper sleeve at least 2 mm larger than said second diameter of the aperture in the lower sleeve.

18. A method for shielding an alignment mark on a wafer in a process chamber according to claim 16 further comprising the step of fabricating said at least one alignment pin and said lower chamber shield in stainless steel.

19. A method for shielding an alignment mark on a wafer in a process chamber according to claim 16 further comprising the step of conducting said fabrication process in a TiN sputtering process.

20. A method for shielding an alignment mark on a wafer in a process chamber according to claim 16 further comprising the step of coating said apertures with a TiN layer.

* * * * *